United States Patent [19]

Morita

[11] 4,352,713
[45] Oct. 5, 1982

[54] VAPOR GROWTH METHOD
[75] Inventor: Shigeru Morita, Kawasaki, Japan
[73] Assignee: Tokyo Shibaura Denki Kabushiki Kaisha, Japan
[21] Appl. No.: 204,953
[22] Filed: Nov. 7, 1980
[30] Foreign Application Priority Data
Nov. 10, 1979 [JP] Japan ............................ 54-145727
[51] Int. Cl.³ ......................................... C30B 25/12
[52] U.S. Cl. .................................. 156/612; 156/614; 156/DIG. 98; 156/DIG. 99; 423/344; 427/94; 148/175
[58] Field of Search .......................... 156/612–614, 156/DIG. 64, DIG. 98, DIG. 99; 422/245; 423/344, 349; 427/86, 94, 95; 148/174, 175; 118/720, 728

[56] References Cited
U.S. PATENT DOCUMENTS

| 3,243,323 | 3/1966 | Corrigan et al. | 156/612 |
| 3,409,483 | 11/1968 | Watson | 427/86 |
| 3,471,326 | 10/1969 | Kappelmeyer et al. | 156/612 |
| 3,553,037 | 1/1971 | Bell | 148/189 |
| 3,652,331 | 3/1972 | Yamazaki | 427/94 |
| 3,734,770 | 5/1973 | Price et al. | 427/95 |
| 4,203,799 | 5/1980 | Sugawara et al. | 156/612 |

FOREIGN PATENT DOCUMENTS

| 2251370 | 6/1975 | France . | |
| 52-11198 | 3/1977 | Japan . | |
| 1146383 | 3/1969 | United Kingdom | 427/94 |

Primary Examiner—Gregory N. Clements
Attorney, Agent, or Firm—Finnegan, Henderson, Farabow, Garrett & Dunner

[57] ABSTRACT

A vapor growth method of forming deposition film on a plurality of substrates disposed within a cylindrical reaction vessel by causing flow of reaction gas under a reduced pressure through the reaction vessel, in which the treated surfaces of substrates are inclined to the upstream side of the reaction gas flow with respect to the axis of the reaction vessel and the individual substrates but the most upstream side one are each shifted in position with respect to the preceding one in a direction perpendicular to the axis of the reaction vessel.

11 Claims, 5 Drawing Figures

VAPOR GROWTH METHOD

This invention relates to a vapor growth method and, more particularly, to a method of causing growth of desired deposited film on the surface of a plurality of substrates in reaction gas atmosphere under a reduced pressure.

Since the reduced pressure vapor growth method is carried out under a reduced gas pressure, the mean free path of the reaction gas particles is long, so that high uniformity of the thickness and quality of the deposited film can be obtained. Also, since in the reduced pressure vapor growth method substrates to be treated are normally disposed vertically in a reaction vessel, it is possible to load a number of substrates in the reaction vessel with high density. Thus, the reduced pressure vapor growth method is a very useful technique in the semiconductor industry and recently finds extensive applications.

However, in the prior-art reduced pressure vapor growth method the gas pressure around substrates disposed in a downstream side of the reaction vessel, i.e., a portion of the interior of the reaction vessel near a reaction gas exhaust port, is low compared to the gas pressure in the upstream side, and also the flow speed of gas passing by substrates is low in the downstream side compared to the upstream side. Therefore, the growth speed of the deposited film differs between the upstream side substrates and downstream side substrates, so that the thickness of film obtained is not uniform over the individual substrates. Particularly, in the reduced pressure vapor growth method the dependency of the growth speed upon the pressure and flow speed of the reaction gas is pronounced compared to the case of the normal pressure thermal oxidation method, thus leading to greater fluctuations the film thickness. In another aspect, in the prior-art vapor growth method substrates are disposed in the reaction vessel to extend at right angles to the direction of flow of gas, so that when evacuating the reaction vessel prior to causing flow of the reaction gas through the vessel the substrates obstruct the flow of air being withdrawn. Therefore, the evacuation cannot be obtained in a short period of time, and also a slight quantity of air remains between adjacent substrates without being exhausted. With slight quantity of air remaining without being exhausted, the control of the film thickness is difficult in case of depositing, for instance, a very thin oxide film. Also, when depositing other films, it is likely that an undesired oxide film is formed on the substrate.

An object of the invention is to provide a vapor growth method which can form desired films of the same and uniform thickness on a plurality of substrates.

According to the invention, there is provided a vapor growth method of forming deposited film on a plurality of substrates disposed within a cylindrical reaction vessel by causing flow of reaction gas under a reduced pressure through the reaction vessel, in which the treated surfaces of substrates are inclined to the upstream side of the reaction gas flow with respect to the axis of the reaction vessel. The individual substrates have the most upstream side shifted in position with respect to the preceding one in a direction perpendicular to the axis of the reaction vessel. In other words, the substrates are arranged in an array within the flowing gas, with the surfaces of the substrates being generally parallel and inclined toward the flow of the reactive gas. The array is oriented at an angle to the central axis of the reaction vessel such that the upstream edge of each substrate projects further into the flowing gas than the upstream edge of the substrate preceding it.

This invention can be more fully understood from the following detailed description when taken in conjunction with the accompanying drawings, in which.

Now, the invention will be described in conjunction with a preferred form thereof with reference to the accompanying drawings.

Figure 1:
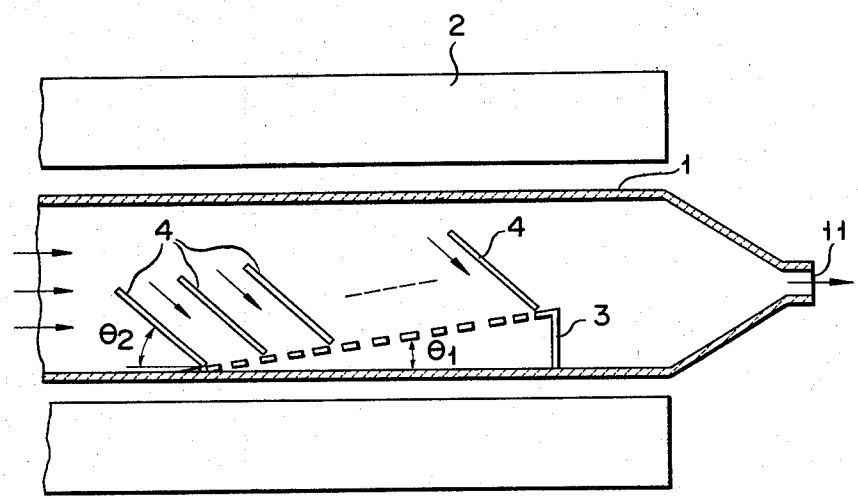
FIG. 1 is a schematic view of an apparatus for carrying out the method according to the invention.

FIG. 1 is a schematic view showing a vapor growth apparatus for carrying out the method according to the invention. In the Figure, designated at 1 is a cylindrical reaction vessel 1, and a furnace 2 is provided to surround the vessel 1. The vessel 1 has an exhaust port 11, which is connected to a vacuum pump (not shown). A susceptor 3 is disposed within the reaction vessel 1 such that its height is increased as one goes toward the exhaust port 11. A plurality of, for instance fifteen, substrates 4 are supported on the susceptor 3. The substrate support surface of the susceptor 3 is inclined to make an angle $\theta_1$ with respect to the axis of the reaction vessel 1. Thus, the substrates 4 have the upstream edge upwardly shifted in position with respect to the preceding one. The treatment surface of each substrate 4 is also inclined to make an angle $\theta_2$ with respect to a direction parallel with the axis of the reaction vessel 1. The angle $\theta_1$ ranges 3° to 30°, preferably 3° to 10°. The angle $\theta_2$ ranges 30° to 80°, preferably 60° to 70°. The substrate support wall of the susceptor 3 may be formed with a number of holes so that it may not block the flow of gas.

With the substrates 4 disposed in the above manner, reaction gas flows through the reaction vessel 1 in a manner as shown by arrows. This flow of gas is very smooth for the substrates 4 offer little resistance against the flow. Particularly, the gas flow in the central portion of the reaction vessel 1 includes downward flow due to convection. Thus, the illustrated arrangement of the substrates 4 can be said to conform to the flow of gas. With this arrangement, the difference in gas pressure and flow speed of gas between the neighborhood of upstream side substrates 4 and neighborhood of downstream side substrates 4 is reduced compared to the case of the prior-art method, in which the surfaces of substrates 4 are arranged to extend perpendicular to the axis of the reaction vessel. Thus, it is possible to obtain deposited film of uniform film thickness and film quality on all the substrates 4. In addition, when evacuating the reaction vessel 1 after arranging the substrates 4 on the susceptor 3, air present between adjacent substrates 4 can be quickly exhausted. Thus, it is possible to obtain deposition of very thin oxide film with highly precise film thickness control and also prevent formation of undesired oxide layer.

Usually, in the manufacture of MNOS (metal nitride oxide semiconductor) memory, a very thin oxide film about 20 Å in thickness is formed on a gate region by the normal pressure vapor growth method, and then a silicon nitride film about 500 Å in thickness is formed by the reduced pressure vapor growth method. By adopting the method according to the invention for the formation of the silicon nitride film, it is possible to obtain silicon nitride film of uniform film thickness and film quality without making the very thin oxide film to be thicker than is necessary, thus permitting MNOS memories having excellent characteristics to be obtained.

While in the above embodiment the substrates have the most upstream side upwardly shifted in position with respect to the preceding one and the treatment surfaces of substrates are inclined to the upstream side, this arrangement of substrates is not limitative, and according to the invention it is also possible to arrange the substrates 4 such that the top view of the arrangement is just as shown in FIG. 1. More particularly, it is also possible to arrange the substrates 4 such that they are each shifted sidewise in position with the most upstream side projecting further into the flowing gas with respect to the preceding one. In addition their treatment surfaces vertically extend and make a constant angle with the axis of the reaction vessel 1.

Some examples of the invention and a comparison example are given to demonstrate the effects of the invention.

In the comparison (or control) example, susceptor 3 was disposed in cylindrical reaction vessel 1 made of quartz and with a diameter of 3.5 inches, which was surrounded by furnace 2, such that it extended parallel to the axis of the reaction vessel 1, and fifteen silicon wafers 4 (3 inches in diameter) (with No. 1 to No. 15 given to them from the most upstream side one) were arranged on the susceptor 3 such that they vertically extend. In this case, $\theta_1=0°$, and $\theta_2=90°$. Then, the reaction vessel 1 was evacuated and heated. Thereafter, $SiH_2Cl_2$ and $NH_3$ were caused to flow through the vessel respectively at 27 cc/min. and 160 cc/min. to cause vapor growth of SiN film on the surfaces of silicon wafers under a vacuum degree of 600 to 700 mmtorr and for a growth period of 27 min. The temperature of the inside of the reaction vessel 1 at this time was 750° to 820° C.

In Examples 1 and 2, the susceptor 3 was inclined with respect to the axis of the reaction vessel 1, and also silicon wafers 4 were forwardly inclined. Then, vapor growth of SiN on the surfaces of silicon wafers was caused under the same conditions as mentioned in the comparison example. In Example 1 the inclinations angles were set to $\theta_1=5°$ and $\theta_2=60°$, and in Example 2 they were set to $\theta_1=10°$ and $\theta_2=60°$.

Figure 2:
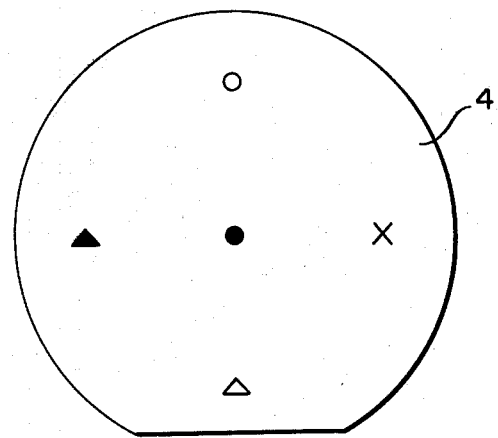
FIG. 2 is a view showing spots of measurement of film thickness of a silicon wafer used in an embodiment of the invention.
Figure 3:
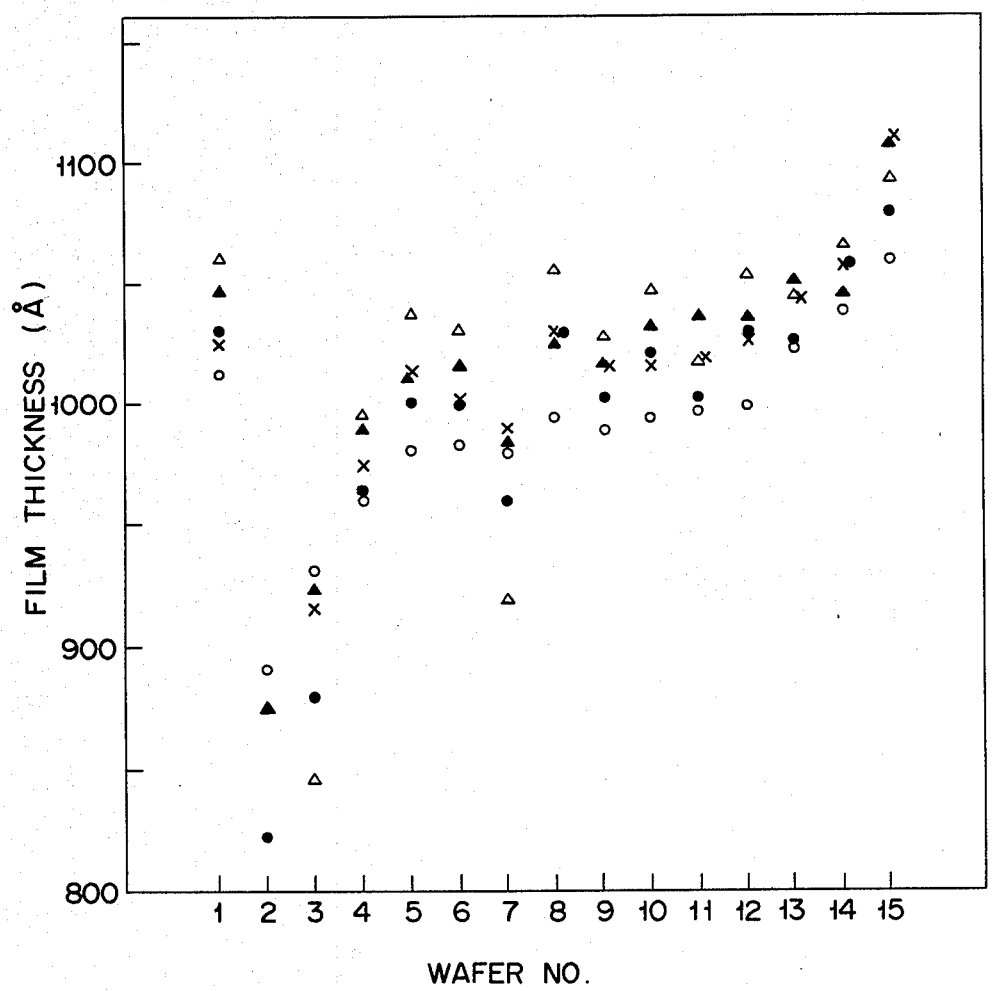
FIG. 3 is a graph showing fluctuations of film thickness of an SiN film obtained in a comparison example according to the invention.
Figure 4:
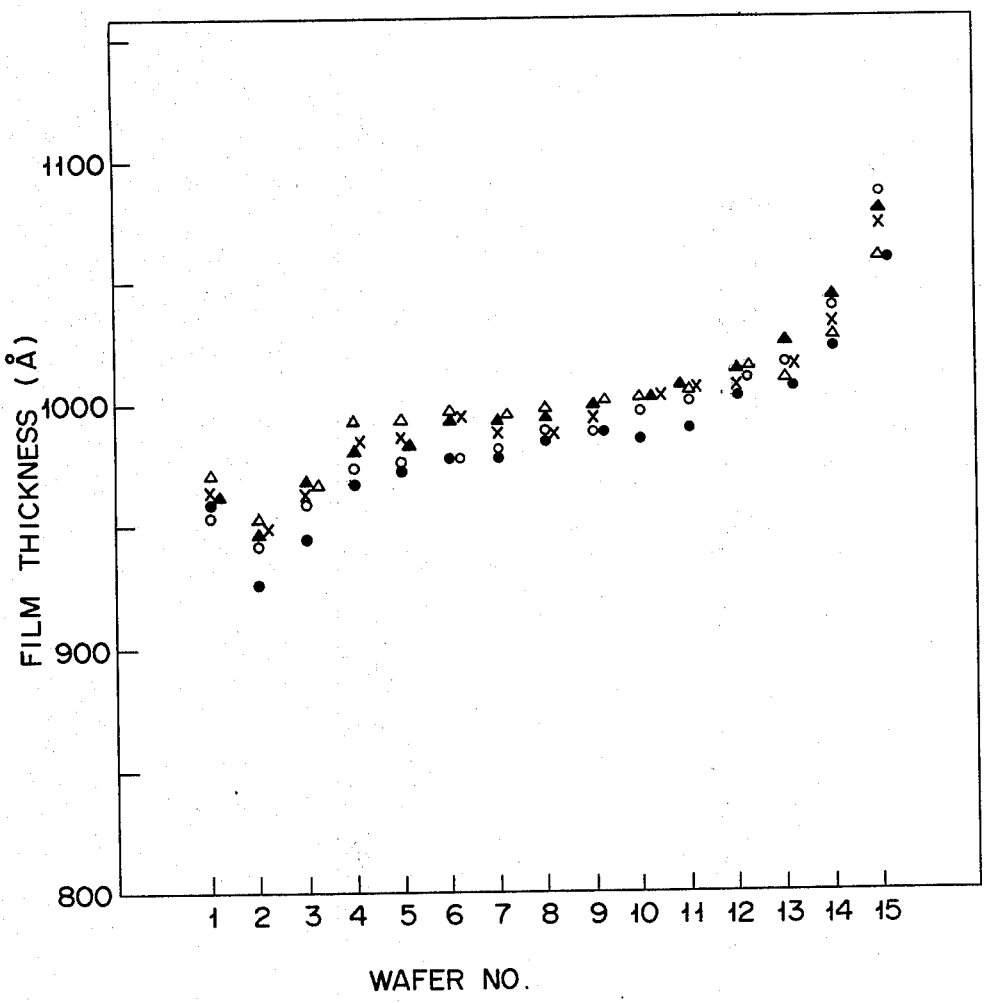
FIGS. 4 and 5 are graphs showing fluctuations of SiN films obtained in examples of the invention.
Figure 5:
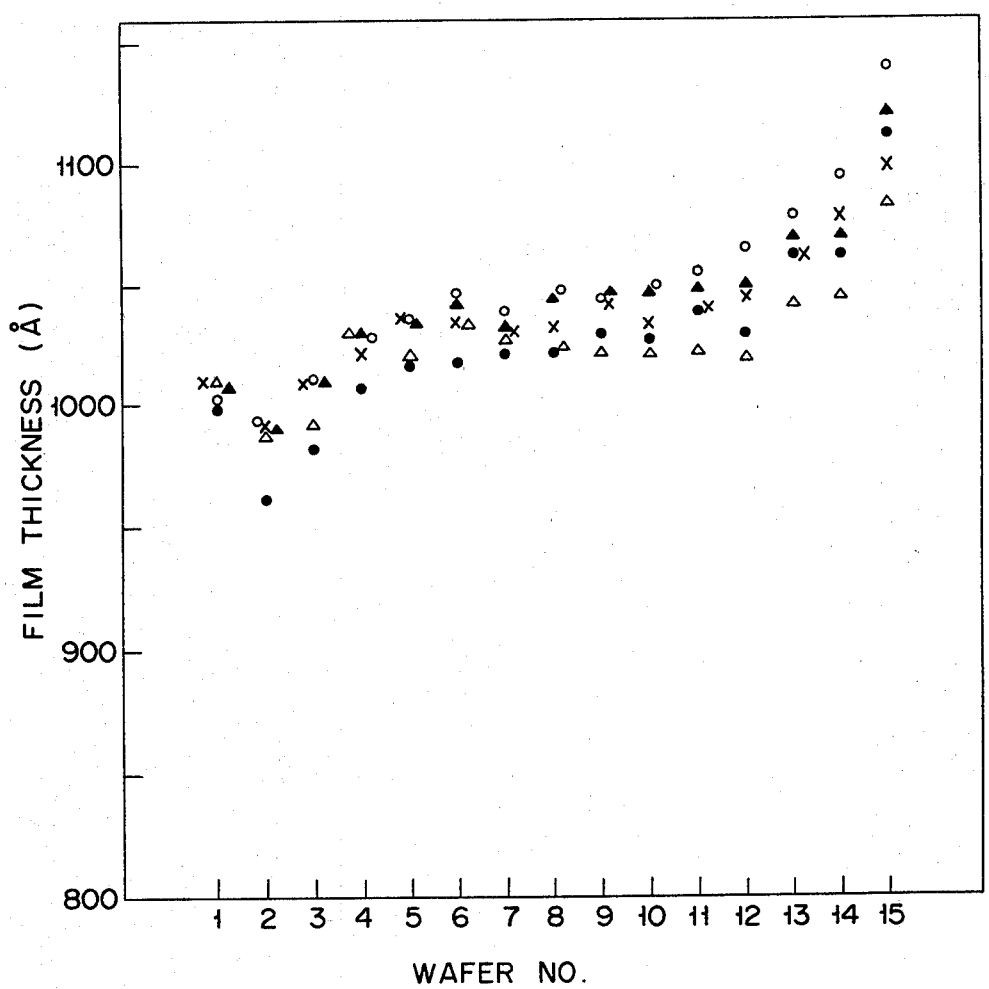

FIGS. 3, 4 and 5 show the results of measurement of the film thickess (in Å) of the total of forty-five silicon wafers treated in the comparison example and Examples 1 and 2. The measurement was made at five points with each wafer, namely the center of the wafer and points one inch spaced apart therefrom upwards, downwards, to the left and to the right respectively as shown in FIG. 2. Marks shown in FIG. 2 correspond to those shown in FIGS. 3 to 5. FIG. 3 shows measurements in the case of the comparison example ($\theta_1=0°$ and $\theta_2=90°$), FIG. 4 shows the case of Example 1 ($\theta_1=5°$ and $\theta_2=65°$), and FIG. 5 shows the case of Example 2 ($\theta_1=10°$ and $\theta_2=60°$).

As will be understood if FIGS. 4 and 5 are compared with FIG. 3, the difference in thickness among the films formed on the wafers is reduced by inclining the susceptor 3 and the silicon wafers 4. FIGS. 4 and 5 further show that each film has a more uniform thickness if the susceptor 3 and the wafers 4 are inclined.

Table 1 below shows uniformity of the film thickness of the wafer with the wafers No. 4 through No. 12 which are usually used as product, and Table 2 shows difference in thickness among the films formed on the wafers.

TABLE 1

|  | $\theta_1$ | $\theta_2$ | Standard deviation of uniformity of film thickness (A) Wafer No. | | | | | | | | |
|---|---|---|---|---|---|---|---|---|---|---|---|
|  |  |  | 4 | 5 | 6 | 7 | 8 | 9 | 10 | 11 | 12 |
| Control | 0° | 90° | 16 | 21 | 19 | 28 | 22 | 16 | 20 | 16 | 20 |
| Example 1 | 5° | 65° | 10 | 8 | 9 | 8 | 5 | 6 | 7 | 12 | 5 |
| Example 2 | 10° | 60° | 10 | 10 | 11 | 6 | 12 | 11 | 12 | 13 | 18 |

TABLE 2

|  | $\theta_1$ | $\theta_2$ | Minimum film thickness (A) | Maximum film thickness (A) | Standard deviation (A) | Average film thickness (A) |
|---|---|---|---|---|---|---|
| Control | 0° | 90° | 919 | 1,056 | 28 | 1,007 |
| Example 1 | 5° | 65° | 967 | 1,014 | 12 | 993 |
| Example 2 | 10° | 60° | 1,007 | 1,065 | 12 | 1,034 |

As has been described in the foregoing, with the method according to the invention it is possible to form desired deposited film of the same and uniform thickness on a plurality of substrates under high precision control.

What is claimed is:

1. A method of forming a film on a plurality of substrates within a generally horizontal elongated reaction vessel having a central axis, an upstream inlet and a downstream outlet, comprising the steps of:
   (a) arranging said substrates along said axis in a substantially parallel array, the planes of said substrates being at an angle to said axis with the upstream edge of each substrate being higher than the downstream edge of the same substrate, the upstream edge of each said substrates projecting higher into the gas flow a distance greater than the upstream edge of the preceding upstream substrate; and
   (b) passing a reactive gas through said vessel at a reduced pressure along said axis from said inlet to said outlet, said gas reacting with said substrates and forming a film thereon.

2. The method of claim 1 wherein said substrates are inclined within said reaction vessel at an angle $\theta_2$ of between 30° and 80° from the central axis of said vessel.

3. The method of claim 2 wherein said angle $\theta_2$ is 60° to 70°.

4. The method of claim 1 wherein said array is oriented at an angle ($\theta_1$) of between 3° and 30° from the central axis of said vessel.

5. The method of claim 4 wherein said angle ($\theta_1$) is from 3° to 10°.

6. The method of any one of claims 1 or 2 to 5 wherein said array of substrates is placed on a susceptor within said reaction vessel.

7. The method of claim 6 wherein said susceptor includes a surface inclined with respect to the central axis of said reaction vessel and said array is disposed on said surface.

8. The method of claim 7 wherein said susceptor includes means for allowing passage of said gas therethrough.

9. The method of claim 8 wherein said means for allowing gas to pass through said susceptor are holes through said susceptor.

10. The method of claim 1 wherein said film is SiN.

11. The method of claim 10 wherein said reactive gas is a mixture of $SiH_2Cl_2$ and $NH_3$.

* * * * *